United States Patent [19]
Borden

[11] Patent Number: 5,966,019
[45] Date of Patent: *Oct. 12, 1999

[54] SYSTEM AND METHOD FOR MEASURING PROPERTIES OF A SEMICONDUCTOR SUBSTRATE IN A FABRICATION LINE

[75] Inventor: Peter G. Borden, San Mateo, Calif.

[73] Assignee: Boxer Cross, Inc., Menlo Park, Calif.

[*] Notice: This patent is subject to a terminal disclaimer.

[21] Appl. No.: 08/637,244

[22] Filed: Apr. 24, 1996

[51] Int. Cl.⁶ ................................................. G01R 31/28
[52] U.S. Cl. ........................ 324/752; 324/750; 324/765
[58] Field of Search ................................. 326/716, 719, 326/750, 751, 752, 765, 766, 767; 250/310, 311, 492.1, 492.2; 437/8; 257/40, 48; 438/14, 17, 18; 356/400, 401

[56] References Cited

U.S. PATENT DOCUMENTS

| | | | |
|---|---|---|---|
| 3,623,818 | 11/1971 | Gardner et al. ........................... | 324/765 |
| 4,851,768 | 7/1989 | Yoshizawa et al. ..................... | 324/751 |
| 5,006,795 | 4/1991 | Yoshizawa et al. ..................... | 324/751 |
| 5,034,683 | 7/1991 | Takahashi et al. ...................... | 324/753 |
| 5,037,202 | 8/1991 | Batchelder et al. . | |
| 5,047,713 | 9/1991 | Kirino et al. ............................ | 324/752 |
| 5,061,070 | 10/1991 | Batchelder et al. . | |
| 5,133,602 | 7/1992 | Batchelder et al. . | |
| 5,422,498 | 6/1995 | Nikawa et al. ............................ | 257/48 |

OTHER PUBLICATIONS

W. Murray Bullis, SEMI (Jan., 1996) "Characterizing microroughness and haze on silicon wafers"—pp. 47–53.
M.A. Nokes, P.B. Borden, Pacific Scientific Co., Sunnyvale, CA (no date indicated) "Differential Interference Contrast Imaging in the Optical Production Profiler".

*Primary Examiner*—Vinh P. Nguyen
*Attorney, Agent, or Firm*—Gray Cary Ware & Freidenrich

[57] ABSTRACT

A system for measuring a property of a semiconductor substrate, wherein an analyzer beam is generated and transmitted to the substrate, and a generation beam, superposed on top of the analyzer beam, is also generated and transmitted to the substrate. A response generated by the generation beam, in the substrate, causes a change in a predetermined characteristic of the analyzer beam that is measured by a detector. The property of the substrate is then determined from the change in a predetermined characteristic. The property measuring system may be used in a semiconductor fabrication process.

41 Claims, 13 Drawing Sheets

SYSTEM AND METHOD FOR MEASURING PROPERTIES OF A SEMICONDUCTOR SUBSTRATE IN A FABRICATION LINE

BACKGROUND OF THE INVENTION

This invention relates generally to a system and method for measuring properties of a semiconductor substrate. In particular, the invention relates to a system and method for measuring properties of a semiconductor substrate or of an electrical device formed on the substrate to provide rapid measurement of variations in the semiconductor fabrication process.

The increased complexity of semiconductor devices has lead to the need for measuring a number of different properties of the substrate that may affect the quality of the semiconductor substrate, such as the conductivity or the presence of defects. As the number of active devices, such as transistors, on a semiconductor substrate, for example, increases, there is a need to measure the various properties of different small areas (i.e., an area less than 2 square micrometers) of the substrate to a high degree of precision, especially as these areas are modified by the manufacturing process. This is especially the case when the substrate properties directly affect the characteristics of devices, such as transistors, diodes, or resistors, for example, formed on or contained within the semiconductor substrate.

There are a number of conventional methods and apparatus for measuring the properties of a semiconductor substrate, and for measuring the properties of active devices and passive devices, such as transistors, resistors, diodes, etc., formed on or in the substrate. For example, the properties of devices formed on or in the substrate may be measured directly once the device on the substrate has been completely manufactured by applying voltages to appropriate electrodes and measuring the response. The difficulty with measuring the properties after the active or passive device has been formed is that the long delay (several weeks) between early fabrication steps and completion makes tight process control impossible, resulting in excess variation in device parameters. There is also no way to change the device property parameter after the fabrication process, or vary the manufacturing process to improve the property of the completed device. In other conventional systems, the surface photovoltage of the substrate may be measured or resistance probes may be attached to the device or the substrate, and the property values inferred from indirect measurements. In these conventional systems, too much area on the substrate must be dedicated to the measurement apparatus for connecting the probes. Thus, these systems can not be used to control the fabrication line, or measure properties of devices during the manufacturing process. The property measurements are made in other systems by destroying the substrate, or the properties of a device are measured indirectly by measuring other properties and calculating the desired property.

None of these conventional methods and apparatus for measuring the properties of a substrate, or for measuring the properties of active or passive devices formed on the substrate, enable the actual property values to be measured during the actual fabrication process. In addition, known systems do not permit the measurement of the properties of very small areas of a substrate, such as a channel of a field effect transistor. These conventional methods for measuring properties are usually carried out on test substrates, and not actual production substrates, which reduces the likelihood that the method will detect localized problems within the manufacturing process. These known systems can not perform real-time monitoring and control of a semiconductor fabrication process.

Thus, there is a need for a system and method for real-time monitoring and measurement of properties in a semiconductor fabrication process to control the fabrication process which avoid these and other problems of known systems, and it is to this end that the present invention is directed.

SUMMARY OF THE INVENTION

The invention provides a system for measuring a property of a semiconductor substrate wherein the property is measured directly by measuring a response in the substrate to carriers generated within the substrate. The system also measures properties of the substrate without destroying the substrate. In addition, the system measures the properties of small areas of the substrate, such as a channel of a transistor. Further, the system has an analyzer system and reference system that are very close to each other, thereby increasing the accuracy of the measuring system in accordance with the invention.

The system also monitors and measures properties of substrates and of devices in a fabrication process in order to control the fabrication process. Thus, an error in a property of an active or passive device in the substrate may be identified rapidly, and the fabrication process may be changed to provide tight control.

In accordance with the invention, the semiconductor substrate property measuring system has a system for generating an analyzer beam, a system for generating a generation beam and a system for focusing the generation beam and the analyzer beam on to the substrate. The generation beam is superposed on top of the analyzer beam and produces a response in the substrate that causes a phase shift of the analyzer beam. The phase shift of the analyzer beam is detected and the property is determined from the phase shift of the analyzer beam.

DETAILED DESCRIPTION OF AN EMBODIMENT

The invention is particularly applicable to a system and method for directly measuring various properties of a device such as a transistor, formed on a semiconductor substrate, such as silicon. It is in this context that the invention will be described. It will be appreciated, however, that the system and method in accordance with the invention has greater utility.

To understand the invention, it is necessary to understand the physical properties and the operation of a device formed on a semiconductor substrate. In particular, the properties and operation of an n-channel field effect transistor (FET) will be described with reference to FIG. 1. However, the system and method in accordance with the invention may also be used with other types of devices formed on or in a substrate, such as a bipolar transistor, a p-channel FET, a pair of complementary metal oxide semiconductor (CMOS) FETs, and capacitors or resistors.

Figure 1:
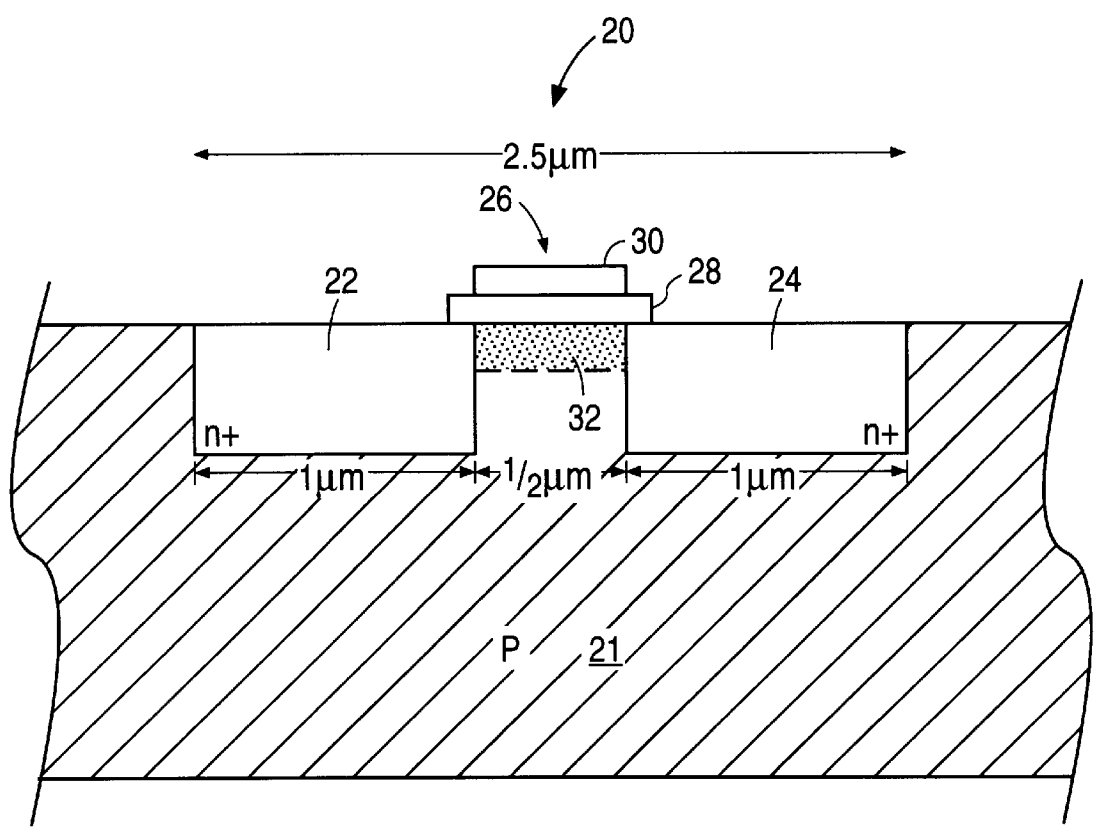
FIG. 1 is diagrammatic view of a semiconductor substrate with a field effect transistor formed in the substrate.

FIG. 1 is a diagram of an n-channel field effect transistor (FET) 20 formed in a semiconductor substrate 21 which may be silicon, but may also be gallium arsenide, indium phosphide, or any other type of substrate used for forming semiconductor devices. In this example, the substrate is a P-type substrate. A P-type substrate has positively charged majority carriers (holes), such as atoms with missing electrons, that carry current. Similarly, electrons, known as minority carriers also carry current. The FET 20 includes a pair of regions 22, 24 that have been doped (i.e., changed atoms have been added) so that their regions now have more negative charge carriers than the substrate. The manner of doping of these regions is well known and will not be described here. In an FET, the first region 22 is known as a source, and the second region 24 is known as a drain. The FET 20 also has a region 26, known as a gate. The gate 26 has an insulating layer 28, that may be silicon dioxide, and a gate electrode 30, that may be made from a polysilicon material. As shown, the FET 20 may be 2.5 micrometers (microns) wide, the source and drain may be 1 micron wide each, and the gate may be 0.5 microns wide. The operation of the FET shown will now be briefly described.

The FET is basically an electrical switch that may be turned on or off by the application of a voltage to the gate. In particular, the application of a positive voltage, for this particular n-channel FET, to the gate electrode 30 attracts electrons to the surface of the substrate in a region 32 between the source 22 and the drain 24. This region is known as a channel. In this FET, the electrons carry the current through the channel, hence the name n-channel. Since the substrate is P-type (i.e., has more positive carriers than negative carriers), the electrons attracted to the channel are minority carriers. The gate insulating layer 28 prevents the electrons in the channel from flowing to the gate electrode 30. Once sufficient positive voltage has been applied to the gate electrode 30, the electrons in the channel form a conducting inversion layer that permits current to flow from the source region 22, through the channel 32 and out the drain region 24. In this state, the FET is turned on. Without sufficient positive voltage applied to the gate, the FET is in an off state and current does not flow from the source to the drain. The gate voltage may be varied to increase or decrease the amount of current that flows from the source region to the drain region.

The performance of an FET is dependent upon a number of its characteristics which are in turn a function of properties of the localized regions of the substrate that form the FET. These properties include, for example, conductivity, resistivity, mobility and the lifetime of carriers, and the values of these properties may vary dramatically over relatively small distances, e.g., between the source and drain of the FET. These properties may be measured by the invention, as described below. In particular, the conductance of the channel region (i.e., the number of electrons that flow within the channel) is a function of the mobility (i.e., how easily the electrons can move) of the carriers within the channel. Similarly, the frequency response of the FET (i.e., the speed that the FET can switch on and off) is a function of the channel resistivity. The conductance of the channel may be calculated using the following formula:

$$g = \left(\frac{Z}{L}\right)\mu_n C_o(V_G - V_T) \quad (1)$$

where Z and L are the width and length of the channel, $\mu_n$ is the electron mobility, $C_o$ is the gate insulator capacitance, $V_G$ is the gate voltage, and $V_T$ is a gate threshold voltage above which the inversion layer forms. Several of these properties are fairly well known or easily measurable, including the length and width of the channel, the gate insulator capacitance, and the various voltages. The electron mobility, $\mu_n$, is not as easily measured, but must be accurately measured to determine the performance of the transistor. The electron mobility may be measured accurately, as described below, by the measuring system, in accordance with the invention.

The cut-off frequency of a transistor (i.e., the maximum speed that the FET can switch states) also depends on the electron mobility and may be determined by the following formula:

$$f_o \le \frac{\mu_n V_D}{L^2} \quad (2)$$

where $V_D$ is the drain voltage, $\mu_n$ is the electron mobility, and L is the length of the channel. Thus, for both the conductance of the channel and the cut-off frequency of the FET, which are critical characteristics of an FET, the minority carrier mobility at the surface, $\mu_n$, is a critical property. There are also several other critical properties of an FET, including the surface recombination velocity, the carrier lifetime, and the diffusion length. The surface recombination velocity is the rate at which carriers (electrons) are recombined with positive charges at the surface, so that the electrons can no longer carry current. The surface recombination velocity is normally small under the gate oxide. The carrier lifetime is the time that excess minority carriers (electrons) survive before they are recombined with a positive charge. The diffusion length is the distance that the minority carriers diffuse into the substrate before they recombine. The diffusion length is a function of the carrier mobility so it may be measured by the measuring system.

The invention advantageously measures these properties of the substrate and/or of the device contained on the substrate, such as the mobility of the minority carriers (electrons) and the lifetime of the minority carriers, as described below. In addition, by determining $\mu_n$, the invention in effect measures key properties of an FET during fabrication.

Figure 2:
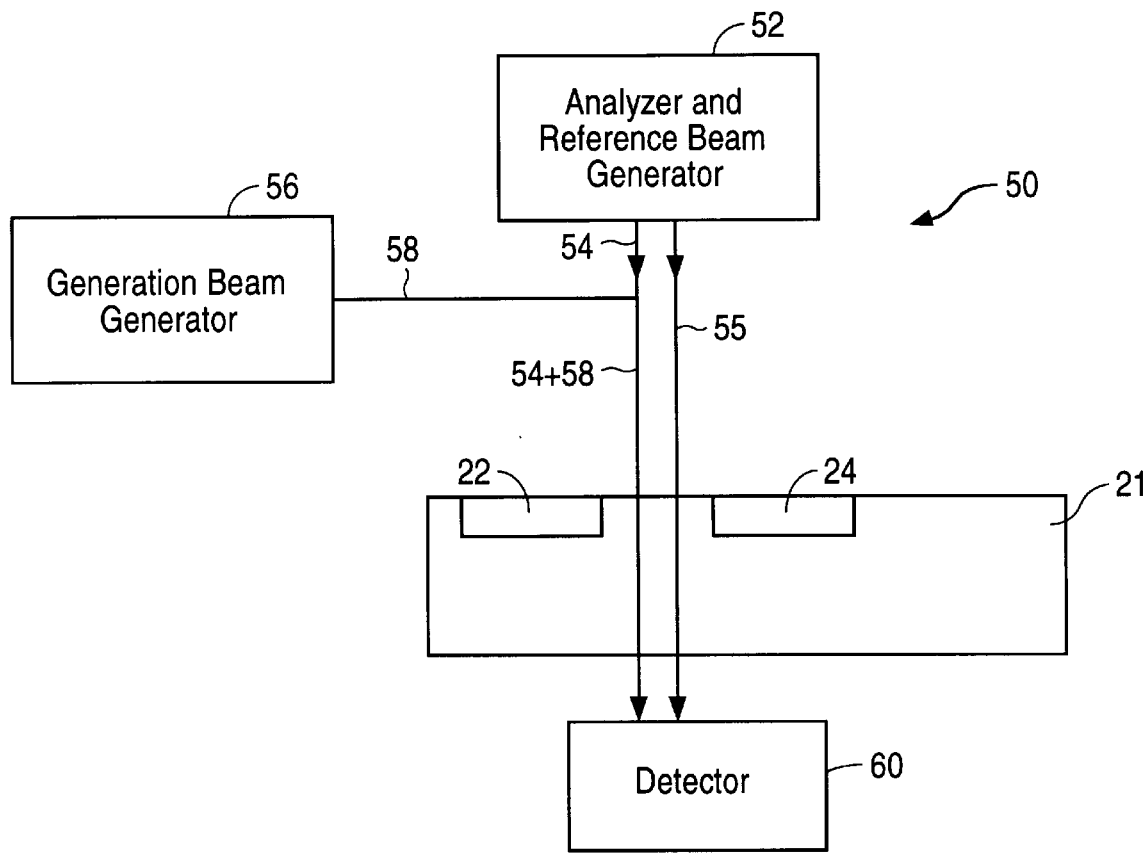
FIG. 2 is a block diagram of a semiconductor substrate property measuring system in accordance with the invention.

FIG. 2 is a block diagram of a transmissive type property measuring system 50, in accordance with a first embodiment of the invention. As will be described, the measuring system 50 measures the values of various properties of a substrate 21 in very small, e.g., micron-sized regions, and in particular, in the channel of the transistor. The measuring system 50 may also be used to measure a variety of other properties of other types of substrates, or of other types of devices fabricated on a substrate, such as bipolar transistors, CMOS transistors, resistors, capacitors, etc. The measuring system 50 may include an analyzer beam generator 52 which generates an analyzer beam 54 and a reference beam 55 of electromagnetic energy, that are substantially parallel because the analyzer beam and the reference beam have a small divergence angle between them. Thus, the beams are not parallel and are divergent, however, over the short distance that they travel in the measuring system, the beams may be considered to be substantially parallel. Preferably, the reference beam and the analyzer beam may be located about 1 micrometer apart to increase the accuracy of the measuring system, as described above, and to permit the measurement of properties of small areas of a substrate. The system for generating the substantially parallel beams will be described below.

The analyzer beam and reference beam may be coherent electromagnetic energy that may be generated by a laser, and may have different polarizations. Preferably, the analyzer beam and the reference beam may be orthogonally polarized relative to one another. The analyzer beam generator directs those two beams towards the surface of the substrate. For the transmissive type measuring system, the wavelengths of the analyzer beam and the reference beam are selected so that the substrate is transparent to both beams. The wavelengths may be, for example, any wavelength greater than 1100 nanometers, and is preferably 1300 nanometers for a silicon substrate, and the beams may have a power level of up to 100 milliwatts, and may preferably be 25 mW due to cost considerations. The wavelength varies depending on the type of substrate being measured since the band gap of each substrate is different. The analyzer and reference beams have a photon energy that is less than the bandgap energy of the substrate so that the beams are not absorbed by the substrate. The bandgap energy of a substrate is the energy necessary to generate conduction electrons in the substrate. Thus, both the analyzer beam and the reference beam pass through the substrate, do not transmit appreciable amounts of energy into the substrate, and do not generate carriers in the substrate. The wavelengths of these beams will vary depending on the type of substrate being measured. A reflective type measuring system, in which the wavelengths of the analyzer beam and the reference beam are selected so that the beams reflect off the substrate and so that absorption is a lesser consideration, is described below with reference to the second embodiment of FIGS. 7 and 8.

The system 50 may also include a generation beam system 56, which generates a generation beam 58. The generation beam system may be a laser that generates coherent light or a white light source. The generation beam may have a wavelength that is selected so that the energy of the generation beam is mostly absorbed by the substrate, because the photon energy of the generation beam is above the bandgap of the substrate. For example, the wavelength of the generation beam may be less than 1100 nanometers and may preferably be 633 nanometers for a silicon substrate and the power level may be less than 25 $\mu$W and may preferably be 10 $\mu$W. The wavelength of the generation beam also depends on the type of substrate being measured. The absorption of the generation beam causes more electrons to be created in the immediate area of the substrate contacted by the generation beam, which in turn increases the conductivity and the index of refraction of that area of the substrate.

As shown, the analyzer beam 54 and the generation beam 58 are superposed, or superimposed on top of each other, as described below with reference to FIG. 3. The system 50 also may have a detector 60 which receives the analyzer beam and the reference beam after the beams pass through the substrate, detects a phase shift in the analyzer beam relative to the reference beam, as described below, and determines the property of a region of the substrate, as described below. The operation of the system will now be described with reference to FIG. 3.

Figure 3:
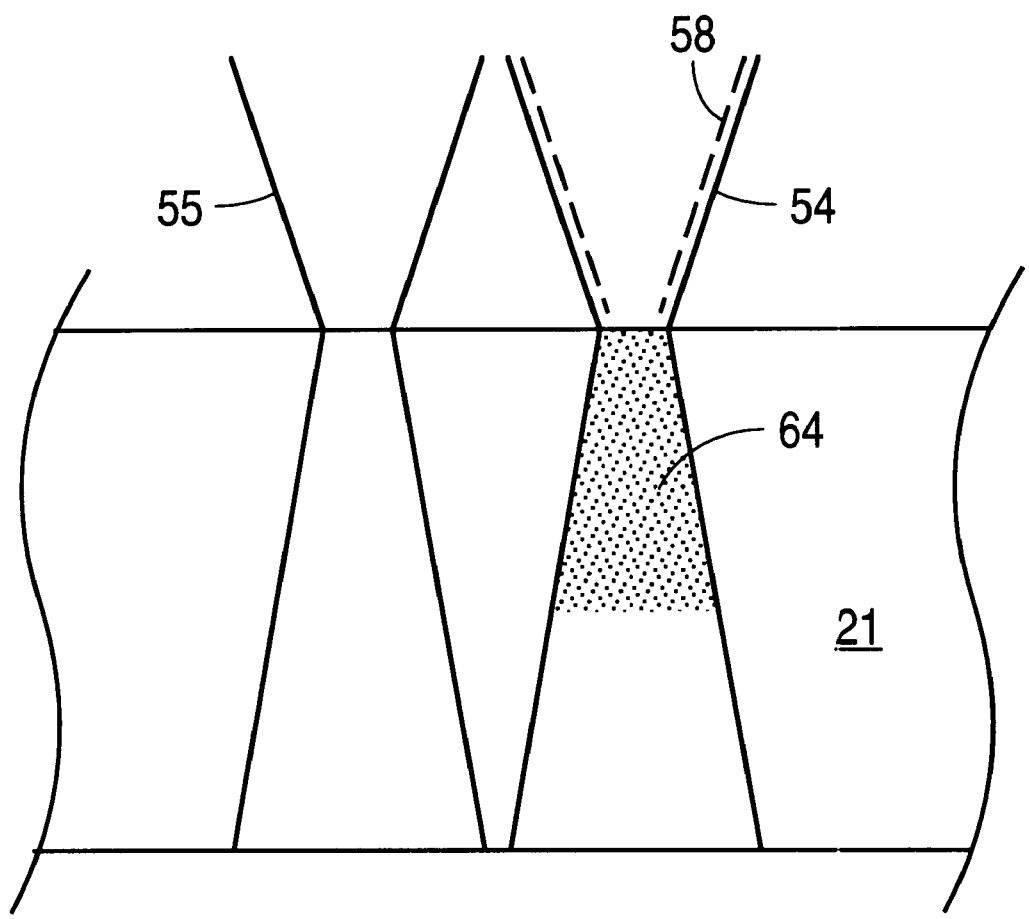
FIG. 3 is an enlarged diagrammatic view of the substrate surface showing an analyzer beam, a reference beam, and a generation beam.

FIG. 3 is detailed view of the substrate 21 with the analyzer beam 54, the reference beam 55, and the generation beam 58 shown. The reference beam 55 passes through the substrate, as described above, and it serves as a reference relative to which the phase shift of the analyzer beam is measured. Since the analyzer beam and reference beam are closely spaced, they pass through the approximate same area of the substrate, so that any local material properties of the substrate affect both beams. Thus, the closely spaced analyzer beam and the reference beam make the measuring system, in accordance with the invention, highly accurate. In order to superimpose the analyzer beam with the generation beam, the two beams may have the same polarization so that when the analyzer beam and the reference beam are separated by a polarized beam splitter, as described below, the analyzer beam and generation beam are superimposed while the reference beam, which has a different polarization, is a separate beam.

The analyzer beam 54, due to its wavelength, also passes through the substrate. However, unlike the reference beam, the analyzer beam is also affected by a localized response that is produced in the substrate by the generation beam due to its superimposition on the analyzer beam. As described above, the wavelength of the generation beam is selected so that the electromagnetic energy of the generation beam is absorbed by the substrate. When the energy from the generation beam is absorbed by the substrate, a response occurs within the localized region of the substrate which absorbs the energy. In the substrate, carriers 64 are generated in the localized region, and these affect the analyzer beam since the analyzer beam and generation beam are superposed on top of each other.

The carriers generated by the generation beam change the conductivity or resistivity of the localized region of the substrate by adding more charge carriers to the region. This change in the conductivity of the substrate causes the index of refraction of the localized region of the substrate to increase, which in turn causes the analyzer beam to pass more slowly through the substrate than the reference beam. Thus, a phase shift of the analyzer beam relative to the reference beam is produced (i.e., the analyzer beam is delayed relative to the reference beam). When the analyzer beam and the reference beam pass through, or reflect off of, the substrate without the generation beam, both the analyzer beam and the reference beam pass through material with the same index of refraction, so that there is no delay of the analyzer beam and no phase shift. In order to zero the measuring system, the generation beam is turned off and any residual phase shift may be accounted for when the measurements are done. This phase shift of the analyzer beam may be detected by the detector 60, which generates an output signal corresponding to the phase shift, as described below, shown in FIG. 2. The carriers generated by the generation beam may also change the amplitude of the analyzer beam relative to the reference beam and this change in the analyzer beam may also be measured to determine various properties of the substrate. The detector may also determine the property being measured from the phase shift of the analyzer beam. Now, a semiconductor fabrication line with a measuring system, in accordance with the invention, will be described with reference to FIG. 4.

Figure 4:
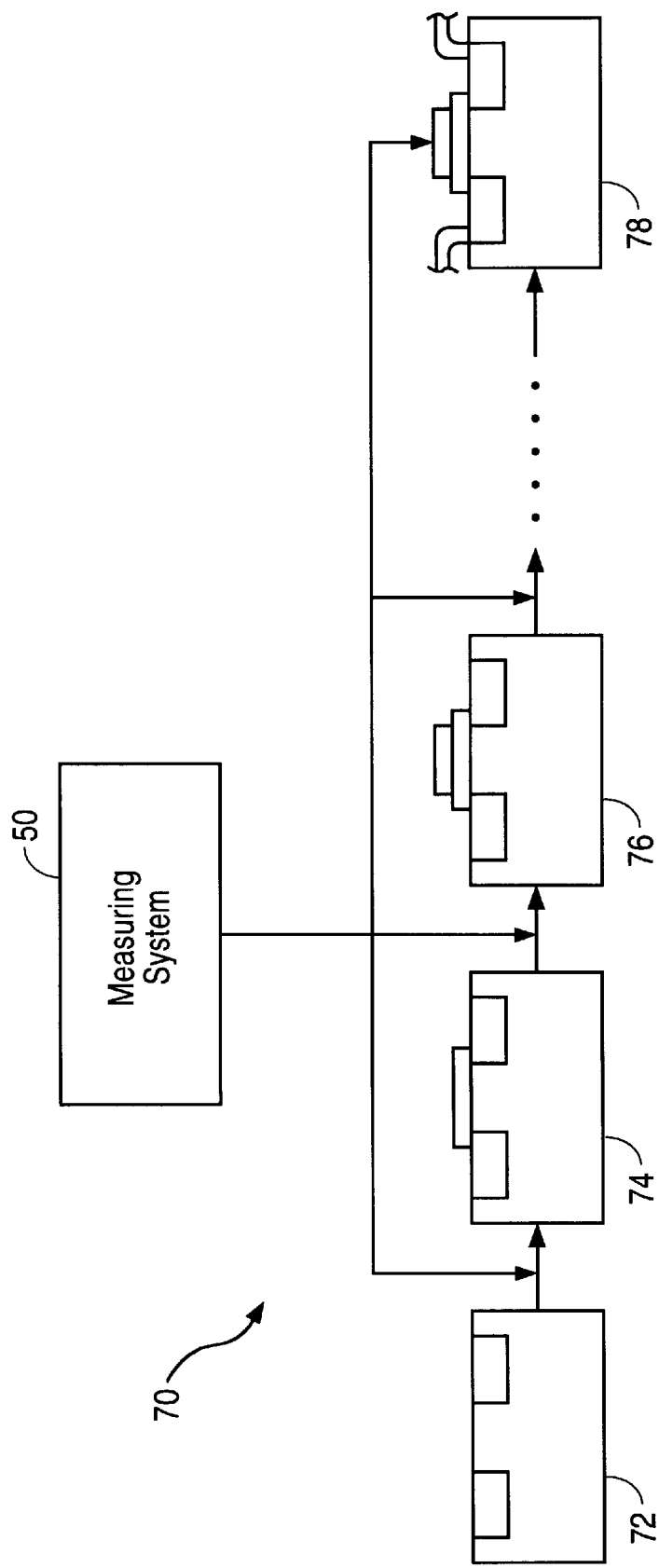
FIG. 4 is a block diagram showing a semiconductor fabrication line and a property measuring system, in accordance with the invention.

FIG. 4 is a block diagram showing a partial semiconductor fabrication line with the measuring system, in accordance with the invention. The fabrication line 70 may include a doping station 72, in which the source and drain regions of the transistor are created, a gate oxide formation station 74, where the gate insulator is formed, a gate electrode station 76, where the gate electrode is formed, and a metalization station 78, in which the metal electrodes connecting the source and drain regions are formed. A partial semiconductor fabrication line only is shown for clarity. As set forth in the table below, various properties may be measured during a semiconductor fabrication line, at various times.

TABLE 1

PROPERTY MEASUREMENTS IN A
0.25 μm FABRICATION PROCESS

| Process Step | Lifetime of Carriers | Conductance (Mobility) |
|---|---|---|
| N-well oxide | X | |
| N-well Drive In | X | X |
| P-well oxide & drive in | X | X |
| Pad Oxide | X | X |
| α-Si and Nitride | X | X |
| Field Vt Implant | | |
| Field Oxide | X | X |
| N and p Vt Implant | | |
| Gate Oxide | X | X |
| N and P LDD Implants | | |
| S/D Oxide | X | |
| S/D Implants | | |
| S/D Anneal | X | X |
| Silicide Deposition | | |
| Silicidation | X | |
| Deposition, Densify | X | |
| BPSG | | |
| Form 5 layer metal | | |

The measuring system 50, in accordance with the invention, may be used to measure lifetime of carriers and mobility, as described below at a number of stages in the production of the transistor to tightly control the fabrication process. Similarly, the measuring system of the invention may measure various properties of any semiconductor process on any substrate, and is not limited to any particular type of semiconductor device or any particular type of substrate. Now, the determining of the property will be described.

For example, the carrier mobility of the substrate may be determined from the phase shift of the analyzer beam relative to the reference beam. First, the phase shift may be determined from the sum and difference of the values of the electric fields of the analyzer beam and the reference beam, as described below, and is given by the equation:

$$V_S |E_\perp + E_1|^2 - |E_\perp - E_1|^2 = P \sin \phi \approx P \phi \quad (3)$$

where $V_S$ is output signal voltage of the square-law detector, $E_\perp$ is the electric field of the analyzer beam with a first polarization, $E_1$ is the electric field of the reference beam with a second polarization, P is the total power of the analyzer beam generator, that may be a laser, and $\phi$ is the measured phase shift between the two beams.

Next, there is a known relationship between the phase shift, $d\phi$, of the analyzer beam relative to the reference beam, and the index of refraction, m(z), of the substrate, which is $$d\phi = k_a \int_0^\infty (m(z) - m(\text{dark})) dz = k_a \int_0^\infty \Delta m(z) dz \quad (4)$$

where $k_a$ is the wave number ($k_a = 2\pi/\lambda$, where π is the wavelength) of the analyzer beam, and m(dark) is the index of refraction of the substrate without any generation beam energy. Thus, the index of refraction of the localized region of the substrate impacted by the generation beam may be measured from the phase shift of the analyzer beam.

The conductivity of the substrate may be calculated from the index of refraction because there is a known relationship between the index of refraction, m(z) of the localized region of the substrate, and the conductivity, σ(z), of the localized region of the substrate, which is:

$$m(z)^2 = \frac{\epsilon}{2}\left(1 + \sqrt{1 + \left(\frac{2\sigma(z)}{V_a \varepsilon}\right)^2}\right) \quad (5)$$

where $V_a$ is the analyzer beam radiation frequency, and ∈ is the dielectric constant of the substrate. Both of these values may be determined based on the wavelength of the particular type of analyzer beam being used, and the particular type of substrate being measured.

From the conductivity, σ, of the localized region of the substrate, it is possible to determine the mobility, $\mu_n$, of the carriers within the substrate, based on a known relationship which is:

$$\sigma(z) = q(\mu_n n(z) + \mu_p p) \approx q(\mu_n n(z) + \mu_p N_D) \quad (6)$$

where q is the electron charge, n(z) is the number of minority carriers generated by the generation beam, $\mu_p$ is the mobility of the majority carriers, $N_D$ is the doping density, and p is the majority carrier concentration. For most semiconductor substrates, the $\mu_n N_D$ term is a constant so it does not change due to the generation beam and can be neglected for purposes of the calculation. Thus, the conductivity, which is known, is a function of the electron charge, the electron mobility, and the number of carriers n(z) generated by the generation beam. The electron charge is a constant, so only n(z) needs to be determined.

Figure 5:
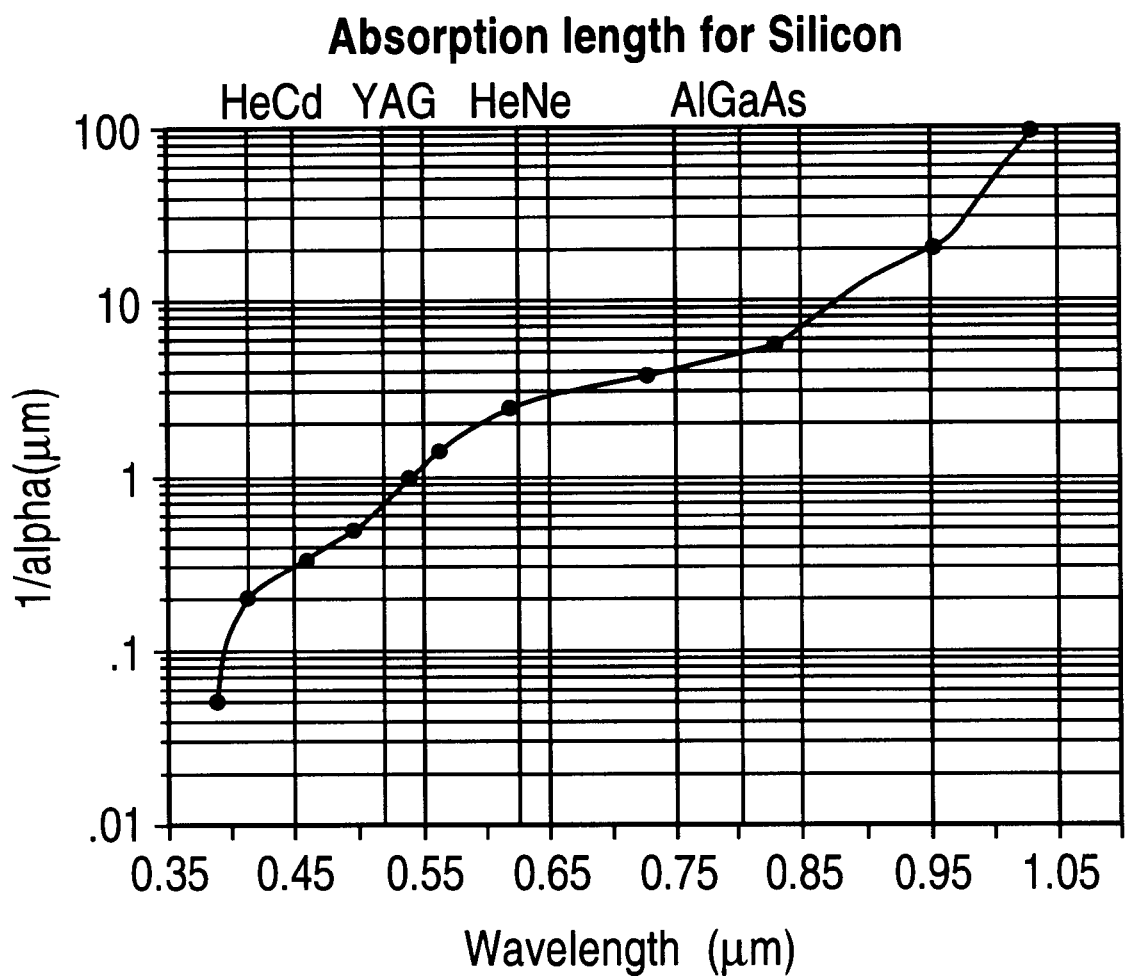
FIG. 5 is a graph showing the absorption lengths of various types of lasers for a silicon substrate.

The number of carriers generated n(z), may be determined from known properties about the generation beam. First, the generation rate of carriers as a function of depth x, G(x,λ) is determined, using the following equation:

$$G(x,\lambda) = \Phi(\lambda) \alpha(\lambda)[1 - R(\lambda)] \exp[-\alpha(\lambda)x] \quad (7)$$

where $\Phi(\lambda)$ is the incident photon flux of the generation beam, R(λ) is the reflectance of the substrate, α(λ) is the absorption coefficient of the substrate, and λ is the wavelength of the generation beam. All of these values may be determined or are well known, but vary depending on the wavelength of the generation beam, or the type of substrate. FIG. 5 shows the relationship of absorption length (1/absorption coefficient) for a silicon substrate and beams of different wavelength. Once $G(x,\lambda)$ is determined, it can be substituted into the diffusion equation which relates the derivative of excess carrier concentration, dn/dt, to $G(x,\lambda)$ and other terms, wherein:

$$\frac{dn}{dt} = D\nabla n + G(x, \lambda) - \frac{n}{\tau} \qquad (8)$$

where D is the diffusivity of the carriers (i.e., how likely the carriers are to diffuse through the substrate) and is equal to $D=(kT/q)\mu$, where k is Plank's constant, $\mu$ is the mobility, T is the temperature, and q is the electron charge. $\tau$ is the lifetime of the minority carriers in the substrate.

The initial condition in time for the equation above is found by solving equation (8) above in the static state, dn/dt=0 to obtain equations shown below as Equations (13), (14), (15), and (16).

For a one-dimensional solution, equation (8) is solved, with the initial condition, subject to the boundary conditions at the front and back surfaces of the substrate, where:

$$\frac{d\Delta n(x)}{dx} = S_s \frac{\Delta n(0)}{D} \text{ at the surface, } x = 0 \qquad (9)$$

$$\frac{d\Delta n(x)}{dx} = -S_b \frac{\Delta n(T)}{D} \text{ at the back, } x = T \qquad (10)$$

where $s_s$ and $s_b$ are the surface recombination velocities at the front and back surfaces of the substrate. Thus, n(z) may be determined, substituted back into equation (8) so that $\mu_n$ can be determined. Thus, from the phase shift of the analyzer beam relative to the reference beam, one can determine the mobility of the minority carriers, in accordance with the invention.

The phase shift of the analyzer beam relative to the reference beam, as described above, may be determined by interfering the analyzer beam and the reference beam. The system required to interfere the analyzer beam and the reference beam will be described below with reference to FIG. 6.

Figure 6:
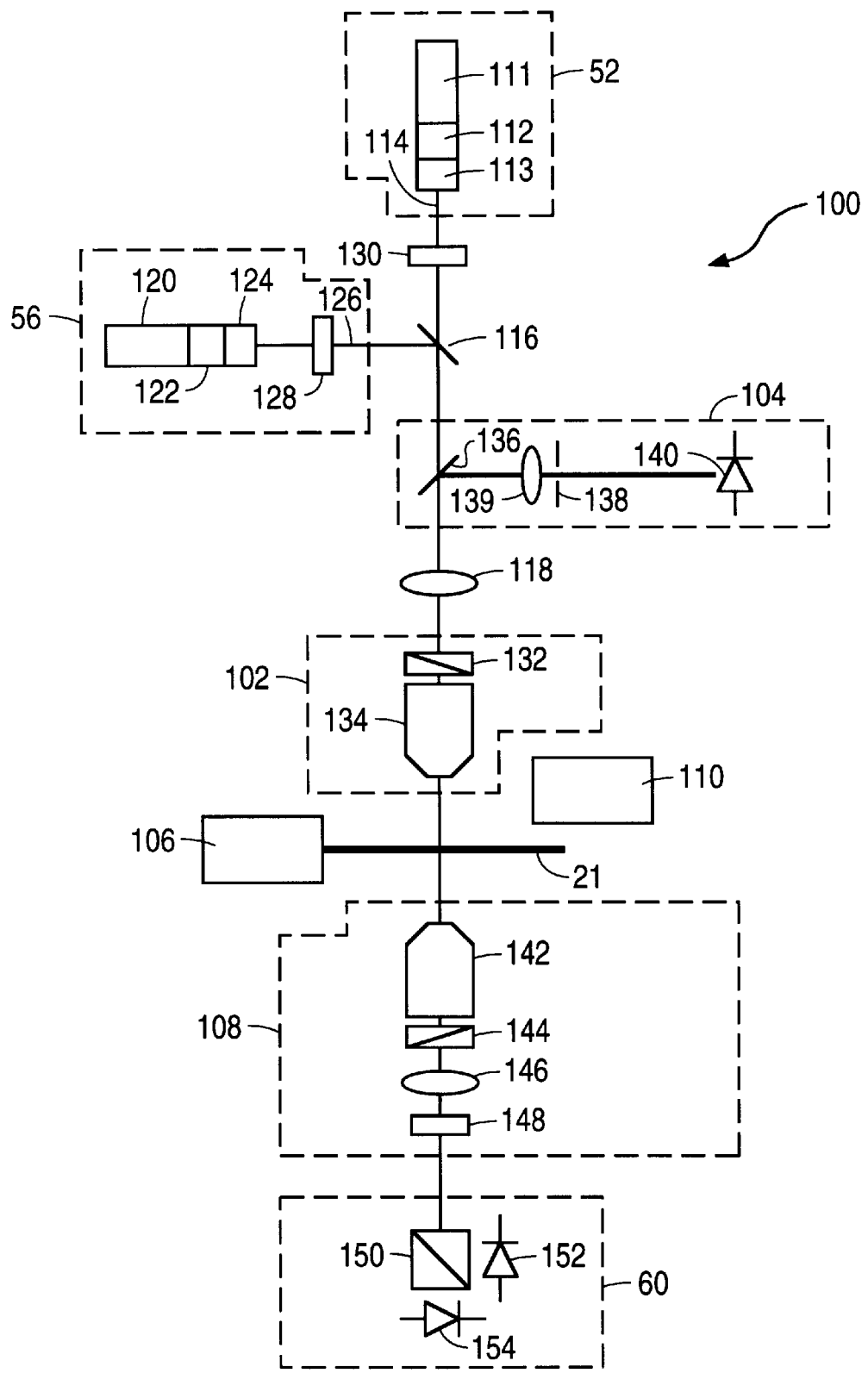
FIG. 6 is a more detailed block diagram of a transmissive type first embodiment of a property measuring system, in accordance with the invention.

FIG. 6 is a block diagram of a transmissive type measuring system 100, in accordance with the invention. A reflective type measuring system, wherein the analyzer beam and reference beam reflect off of the substrate, in accordance with the invention, will be described below with reference to FIGS. 7 and 8. With reference to FIG. 6, the transmissive type measuring system may include the analyzer beam generator 52, the generation beam system 56, the detector 60, a focusing system 102, a substrate aligning system 104, a substrate positioning system 106, and a recombining system 108. A substrate bias system 110 may provide a cloud containing charge carries that settle on the surface of the substrate and electrically bias the substrate. Each of these systems within the transmissive type measuring system will be described below in more detail.

The analyzer beam generator 52 generates the analyzer beam and the reference beam, and may include a laser 111, that may be a diode-pumped yttrium aluminum garnet (YAG) laser that may emit a beam 114 of coherent light. The beam 114 may preferably have a power of 25 mW, and a wavelength of more than 1100 nm, and preferably about 1300 nm for a silicon substrate. This wavelength is selected because it is the maximum transmission wavelength for a silicon substrate (i.e., it is the wavelength of electromagnetic radiation that is absorbed least by the substrate). For different substrates, the minimum wavelengths of transmission will be different so that lasers of different wavelengths may be needed. The selection of the wavelength of the analyzer beam generator is well known, and can be calculated for any substrate, such as silicon, gallium arsenide, or indium phosphide.

The analyzer beam generator also may include an isolator 112 to prevent light from being reflected back into the laser which improves beam stability, and a beam expander 113 that increases the size of the beam so that it fills the aperture of an objective in the focusing system 102. The analyzer beam generator also may include a beam splitter 116 that combines (i.e., superposes) the beam 114 and a generation beam 126 on top of each other, and a lens 118 to focus the beam.

The generation beam system 56 which produces the generation beam, may include a generation laser 120, which may be a semiconductor diode laser emitting a generation beam 126. The generation beam may have a wavelength of less than 1100 nm, and preferably about 630 nanometers for a silicon substrate and a power of a few microwatts. This laser may also be replaced by a white light source and a monochrometer so that a plurality of wavelengths may be easily produced. As described above, the generation beam wavelength may be selected so that the generation beam has a photon bandgap less than that of the substrate so that the energy of the generation beam is absorbed by the localized region of the substrate. The bandgap varies depending on the type of substrate. The generation beam system may also include a modulator (not shown), or the laser itself may be modulated to provide a time varying generation beam useful for measuring the lifetime of the carriers within the substrate, as described below.

The generation beam system 56 may also include an isolator 122 and a beam expander 124, as described above. In addition, a polarizer 128 adjusts the polarization of the generation beam 126 so that the polarization of the generation beam is the same as the analyzer beam, but not the reference beam, as described below. There may also be an attenuator that may weaken the generation beam so that the generated concentration is lower than the background hole concentration, which is known as low level injection. The correctly polarized generation beam from the waveplate strikes the beam splitter 116, where the beam 114 from the analyzer beam generator is combined with the beam 126 from the generation beam system 56. This combined beam then passes through the lens 118 that adjusts the back focus of an objective within the focusing system 102.

At this point, the beam 114 has two components, a first polarization component (the analyzer beam), and a second polarization component (the reference beam). As described above, the generation beam has the same polarization, due to waveplate 128, as the analyzer beam so that the generation beam and analyzer beam are superimposed. Then, as described below, when the analyzer beam and reference beam are split apart in the focusing system, two substantially parallel beams are formed: a combined analyzer/generation beam with a first polarization; and a reference beam with a second polarization. The different polarizations of the analyzer beam and the reference beam permit the two beams to be recombined, as described below, without interfering them with each other.

The focusing system 102 splits the beam 114 from the analyzer beam generator 52 into the combined analyzer/ generation beam and the reference beam, and then focuses the beams onto the substrate. The focusing system 102 may include a waveplate 130 that may circularly polarize the analyzer beam in order to permit the detection of defects, as described below. The focusing system also may include a Wollaston prism 132, that splits the beam 114 from the analyzer beam generator 52, and creates an analyzer/ generation beam and a reference beam with orthogonal polarizations that are slightly divergent. The divergence angle of the analyzer beam and the reference beam determines the amount of separation of the beams as they pass through the substrate. The separation of the analyzer beam and the reference beam may be selected depending on the measurement being made, but is preferably one micrometer apart, so that the beams are exactly adjacent but do not overlap. The prism 132 may be a Nomarski phase plate that generates an analyzer beam and a reference beam having orthogonal polarizations, along with a single generation beam that is superposed over the analyzer beam, as described above. An objective 134 focuses the superposed analyzer/generation beam and the reference beam onto the substrate surface. The objective may be a 100× microscope objective with a high numerical aperture, on the order of 0.85, to provide a small focal spot on the order of 1.9 μm in diameter for each beam.

The substrate may be moved by the substrate positioning system 106, that may include a stage (not shown) that moves the substrate in small discrete increments. The measuring system may also be moved instead of the substrate. To align the substrate surface with the measuring system, the aligning system 104 is used which may include a beam splitter 136, an autofocus pinhole 138, a lens 139, and a photodetector 140. The beam splitter diverts a small amount of light reflected back from the substrate surface through the autofocus pinhole and onto the photodetector. When the substrate is exactly at the focus of the objective 134, the spot at the back focus of lens 139 (i.e., the pinhole) will be a minimum diameter, and the signal from the photodetector 140 will be maximized. Thus, the substrate may be easily aligned with the measuring system.

Once the analyzer beam and reference beam pass through the substrate (remember that the generation beam is absorbed by the substrate), they enter the recombining system 108. The recombining system may include an objective 142 that is identical to the objective 134 of the focusing system, a Wollaston prism 144, a lens 146, and a filter 148. The Wollaston prism, that may be a Nomarski phase plate, recombines the analyzer beam and the reference beam together into a single beam, but does not interfere the beams with each other since they have different polarizations. The lens 146 recollimates the recombined beam. The filter 148, which may be a colored glass filter, removes any remaining generation beam light and energy that was not absorbed by the substrate.

The recombined analyzer/reference beam enter the detector 60, which may include a polarizing beam splitter 150, a first photodetector 152 and a second photodetector 154. The polarizing beam splitter is mounted at a 45° angle to the two orthogonal polarizations of the analyzer beam and the reference beam. The polarizing beam splitter mixes the two orthogonally polarized components of the beam and provides a sum of the electric fields of the components to the first photodetector 152, and a difference of the electric fields of the components to the second photodetector 154. The signals from these two photodetectors may then be subtracted, from each other (by a difference amplifier, not shown), in order to provide a signal that is a measure of the phase shift of the analyzer beam relative to the reference beam. Thus, measuring the phase shift of the analyzer beam relative to the reference beam, as described above, permits the measurement of the conductivity, or the lifetime of the carriers in the substrate, as described below in more detail.

The measuring system, in accordance with the invention, may be reset or zeroed, in a easy fashion. In particular, the phase shift of the analyzer beam relative to the reference beam is measured without any generation beam energy (i.e., the generation beam is off). This permits the accurate measurement of a zero reference point, taking into account any phase shifts caused by small defects in the measuring system optics, differences in the substrate regions illuminated, coatings on the substrate surface, or surface imperfections of the substrate.

The noise within the measurement system may be calculated. The largest noise component present within the system is shot noise, the noise created when a photon sometimes creates an electron in the conduction band of the photodetector. The shot noise power for each photodetector is $$I_{shot} = \sqrt{2qPA(BW)} \tag{11}$$

where BW is the bandwidth of the photodetectors q is the electron charge, P is the energy of the light, and A is the conversion efficiency of the photodetectors. Thus, the minimum detectable phase shift, $\phi_{min}$, assuming a 2:1 signal-to-noise ratio and a peak noise four times the shot power noise, is:

$$\Phi_{min} = \sqrt{\frac{8q(BW)}{PA}} \tag{12}$$

For a bandwidth of 20 kHz, a power of 25 mW, a conversion efficiency of 0.5 A/W, the minimum detectable phase shift is 0.5 μradians. The minimum detectable phase shift is so small that the power of the system may be reduced below 25 mW if needed. For mobility, a measurement on the order of less than 0.2 mradians is needed, so the property measuring system in accordance with the invention has 100 times more signal-to-noise ratio than needed for measuring mobility. Now, a reflective type measuring system, in accordance with the invention, will be described with reference to FIGS. 7 and 8.

Figure 7:
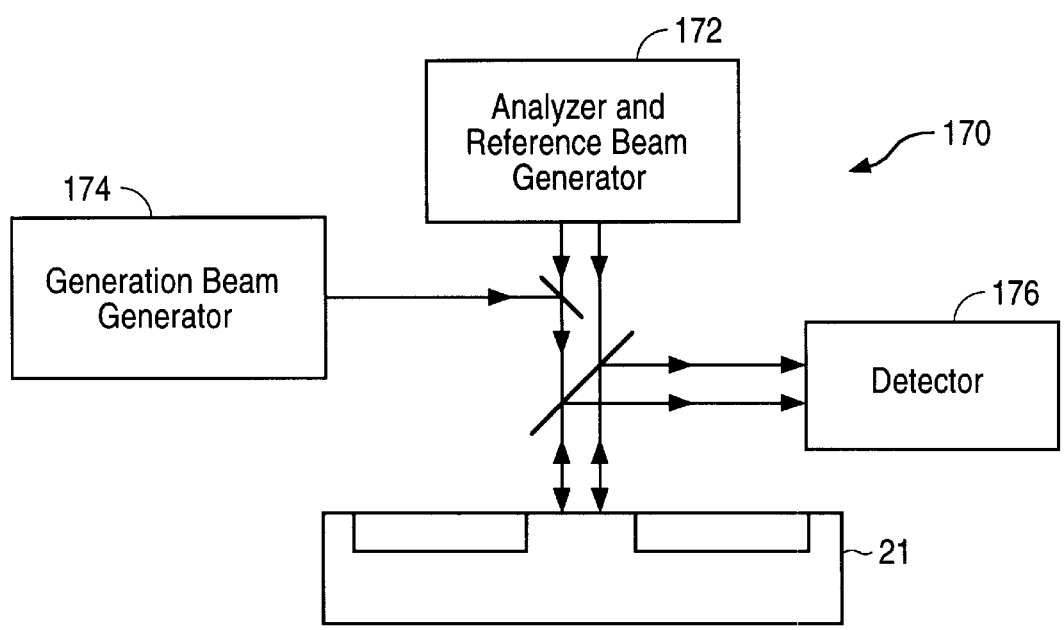
FIG. 7 is a block diagram of a reflective type second embodiment of a property measuring system in accordance with the invention.

FIG. 7 is block diagram of a reflective type measurement system 170 in accordance with the invention. The reflective type measurement system operates in the same manner as the transmissive type measurement system, and has many similar components as the transmissive measurement system. The reflective measurement system has the additional advantage of having fewer components which reduces the overall cost of the system, without sacrificing any performance. As shown, the substrate 21 is placed beneath the reflective measurement system 170, that may include an analyzer beam generator 172, a generation beam system 174, and a detector 176. The analyzer beam generator, the generation beam system, and the detector operate in a similar manner as the corresponding systems of the transmissive measurement system, except that the analyzer beam and reference beam reflect off of the substrate because the photon energy of the beams is greater than the bandgap of the substrate. The wavelengths of the beams may be less 1100 nanometers, as preferably about 530 nanometers. Briefly, a combined analyzer/generation beam and a reference beam contact the surface of the substrate, a phase shift of the analyzer beam occurs as the analyzer beam penetrates the substrate, strikes the graded index of refraction generated by the generation beam and reflects back, the reference beam is also reflected back by the substrate, and the property of the substrate is determined from the phase shift. As above, the wavelength of the generation beam may be varied depending on the how deep the generation beam is supposed to penetrate the substrate. In fact, as described above, a plurality of wavelengths may be used for the generation beam so that the conductivity or lifetime of the carriers in the substrate may be measured at a plurality of different substrate depths. In this reflective measuring system, the change in the index of refraction of the substrate, as described above, causes the analyzer beam to pass through the substrate more slowly than the reference beam before it is reflected back to the detector.

Figure 8:
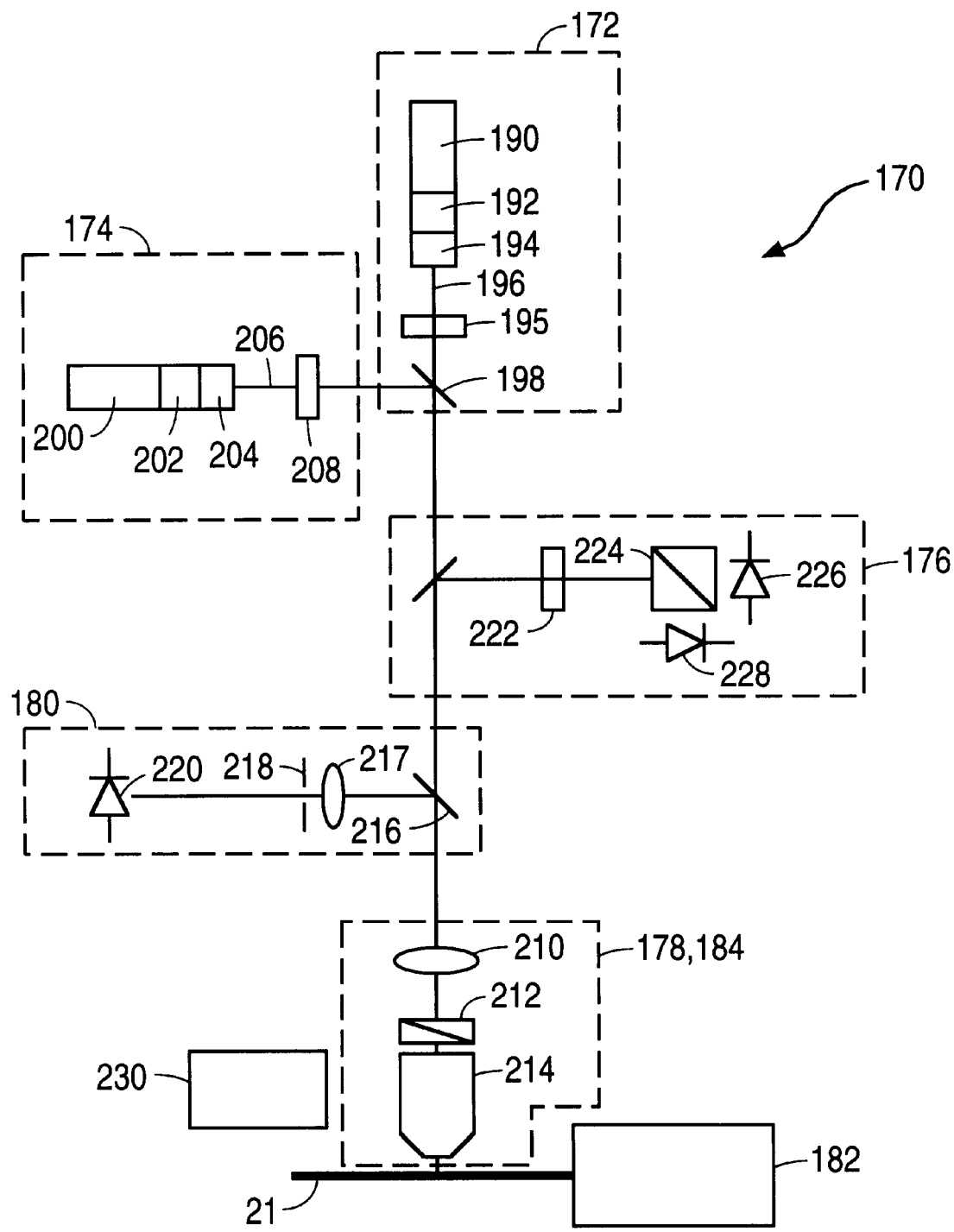
FIG. 8 is a more detailed diagram of the reflective type property measuring system, shown in FIG. 7.

FIG. 8 is a more detailed block diagram of the reflective type measuring system in accordance with the invention. As with the transmissive type measuring system, shown in FIG. 6, the reflective measuring system has many similar components that will not be described in detail because they are described above. The reflective system 170 may include the analyzer beam generator 172, the generation beam system 174, the detector 176, a focusing system 178, an aligning system 180, a substrate positioning system 182, and a recombining system 184. In this reflective type system, however, the recombining system 184 and the focusing system 178 use the same physical components which reduces the cost of the overall system.

The analyzer beam generator 172 may include a light beam generator 190, such as a laser, as described above, an isolator 192, a beam expander 194 to generate a beam 196 that impinges on a beam splitter 198, and a waveplate 195 to adjust polarization of the beam. The generation beam system 174 may include a light beam generator 200, such as a laser or a white light source, as described above, an isolator 202 and a beam expander 204 that generate a generation beam 206 that impinges on a waveplate 208 that adjusts the polarization of the generation beam, as described above. There may also be an attenuator that may weaken the generation beam so that the generated concentration is lower than the background hole concentration, which is known as low level injection. The beam 196 and the generation beam 206 are then combined together by the beam splitter 198. As described above, the generation beam is superposed over only the analyzer beam.

The combined beam enters the focusing system 178 that separates the beam 196 into an analyzer/generation beam with a first polarization, and a reference beam with a second polarization, and focuses the beams onto the substrate. The focusing system may also include a lens 210 for focusing the beam, as described above, a Wollaston prism 212 for separating the analyzer/generation beam and the reference beam, as described above, and an objective 214 for focusing the beam onto the substrate, as described above.

The aligning system 180 may include a beam splitter 216 for diverting a portion of the beam reflected from the substrate, a lens 217, an autofocus pinhole 218 and a photodetector 220 that operate in the same manner as the aligning system 104 shown in FIG. 6. The substrate positioning system 182 may include a stage (not shown) for moving the substrate independently in three axes, as described above.

The recombining system 184 of the reflective type measuring system 170 uses the same physical elements as the focusing system 178 and thus reduces the cost of the reflective type measuring system. The recombining system operates in the same manner as the recombining system 108 shown in FIG. 6.

Finally, the detector 176 may include a filter 222 for filtering out any residual energy from the generation beam that was reflected back from the substrate, a polarizing beam splitter 224 for generating a sum and difference signal of the recombined analyzer and reference beams, as described above, a first photodetector 226, and a second photodetector 228. The photodetectors 226, 228, as above, receive a sum and difference signal, respectively, from the polarizing beam splitter. As above, the sum and difference signals may be subtracted from each other to determine the phase shift of the analyzer beam relative to the reference beam. The reflective measuring system operates in the same manner as the transmissive type system, described with reference to FIG. 6, and the operation of the reflective system will not be described here. A substrate bias system 230 may provides a cloud containing charge carries that settle on the surface of the substrate and electrically bias the substrate.

Both the transmissive and reflective type measuring systems, described with reference to FIGS. 6 and 8, respectively, may be operated in three different modes. In particular, the measuring systems, in accordance with the invention, may be operated in either: 1) a DC generation mode to measure the mobility of carriers in the substrate; 2) a modulated generation mode for measuring the lifetime of the carriers in the substrate; or 3) an imaging mode to detect defects within the substrate. Each of these modes of operation of the measuring system will be described below.

In the imaging mode to detect defects in the substrate, the generation beam may be turned off because no addition carriers need to be generated. However, the generation beam may also be turned on, from time to time, whenever a defect is detected in order to determine whether or not the defect is electrically active. In either case, in operation, the substrate is scanned through the analyzer beam and the reference beam and the scatter from the defects within the substrate interferes with either beam, and causes a phase shift of that beam. As above, this phase shift is measured and indicates that a defect exists within the substrate.

Figure 9:
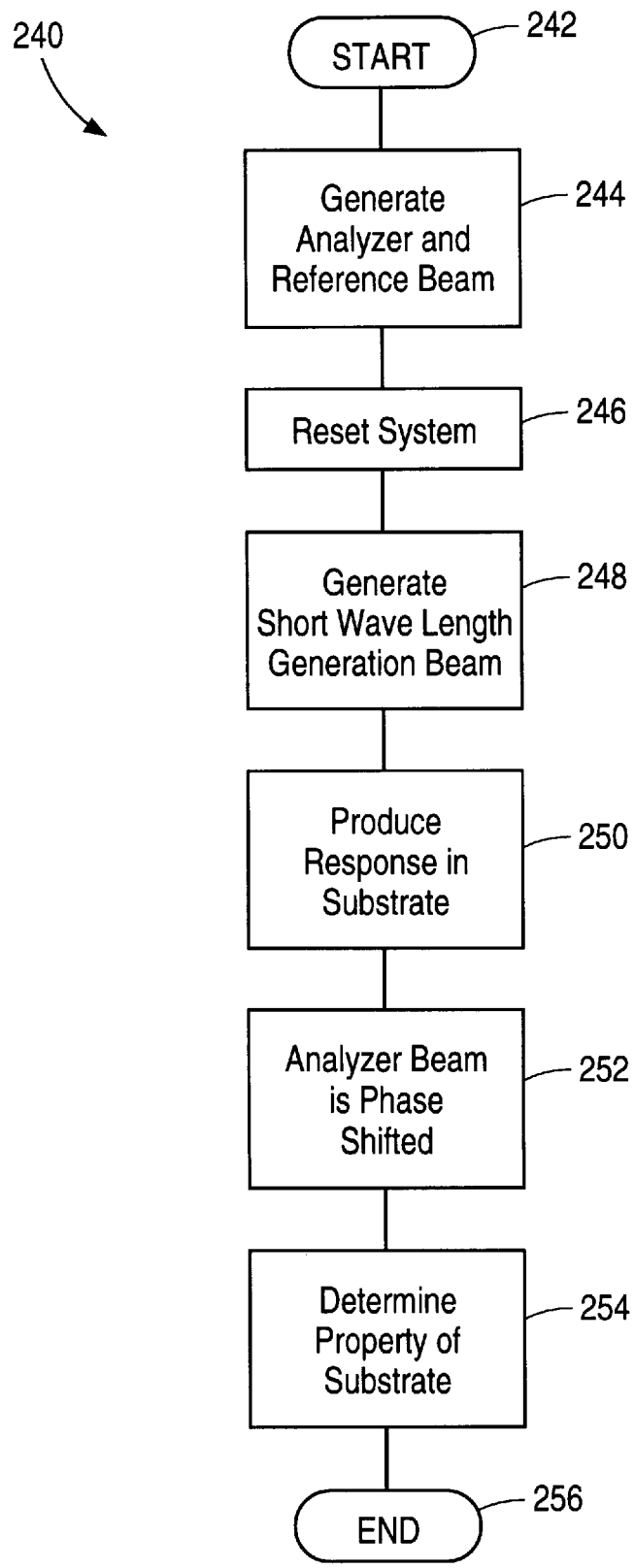
FIG. 9 is a flowchart showing a method of measuring a mobility property of a region of a substrate in accordance with the invention.

FIG. 9 is a flowchart showing the method of measuring mobility and doping using the measuring system in accordance with the invention. To measure mobility, a short wavelength generation beam is used in order to measure the mobility of the carriers generated near the surface of the substrate (i.e., carriers in the channel). The method 240 begins in step 242. In step 244, the system generates the analyzer beam and reference beam of the appropriate wavelength and transmits them to the substrate. In step 246, the measuring system is zeroed by running the analyzer beam alone, as described above. Then in step 248, the generation beam system generates a generation beam with a shorter wavelength so that the generation beam is absorbed and carriers are generated near the surface of the substrate, such as in the channel of a transistor. This generation of carriers in the substrate causes a response in the substrate (i.e., an increase in the number of minority carriers in the substrate), in step 250. This increase in the density (number per unit areas) of the minority carriers causes an increase in the index of refraction of the substrate and the conductivity of the substrate, that in turn causes a phase shift of the analyzer beam, in step 252. Referring back to equation 8, equation 8 is solved subject to the boundary conditions in equations 9 and 10, and the phase shift is found to be a function of carrier mobility, giving the equations:

$$\Delta n(x) = \frac{(1-R)\Phi\alpha\tau}{(\alpha^2 L^2 - 1)}\left[\frac{A_1}{D_1} + e^{-\alpha x}\right] \quad (13)$$

$$A_1 = \left(\frac{s_f s_b L}{D} - S_b \alpha L\right)\sinh\left[\frac{(T-x)}{L}\right] + (s_f + \alpha D)\cosh\left[\frac{(T-x)}{L}\right] \quad (14)$$

$$B_1 = \left(\frac{s_f s_b L}{D} - S_b \alpha L\right)\sinh\left[\frac{x}{L}\right] + (s_f - \alpha D)\cosh\left[\frac{x}{L}\right] \quad (15)$$

$$D_1 = \left(\frac{s_f s_b L}{D} + \frac{D}{L}\right)\sinh\left[\frac{T}{L}\right] + (s_f + s_b)\cosh\left[\frac{T}{L}\right] \quad (16)$$

where T is the thickness of the semiconductor layer being measured. From equations (4) and (5) the phase shift is used to determine An that is matched to these equations (14), (15), (16) to determine the mobility. To simplify these equations, $s_f \approx 0$ and depending on the substrate, $s_b \approx 0$ or $s_b$=large. Once these equations are solved, in step 254, the carrier mobility is determined from the phase shift of the analyzer beam. The method of measuring the carrier mobility ends at step 256.

Figure 10:
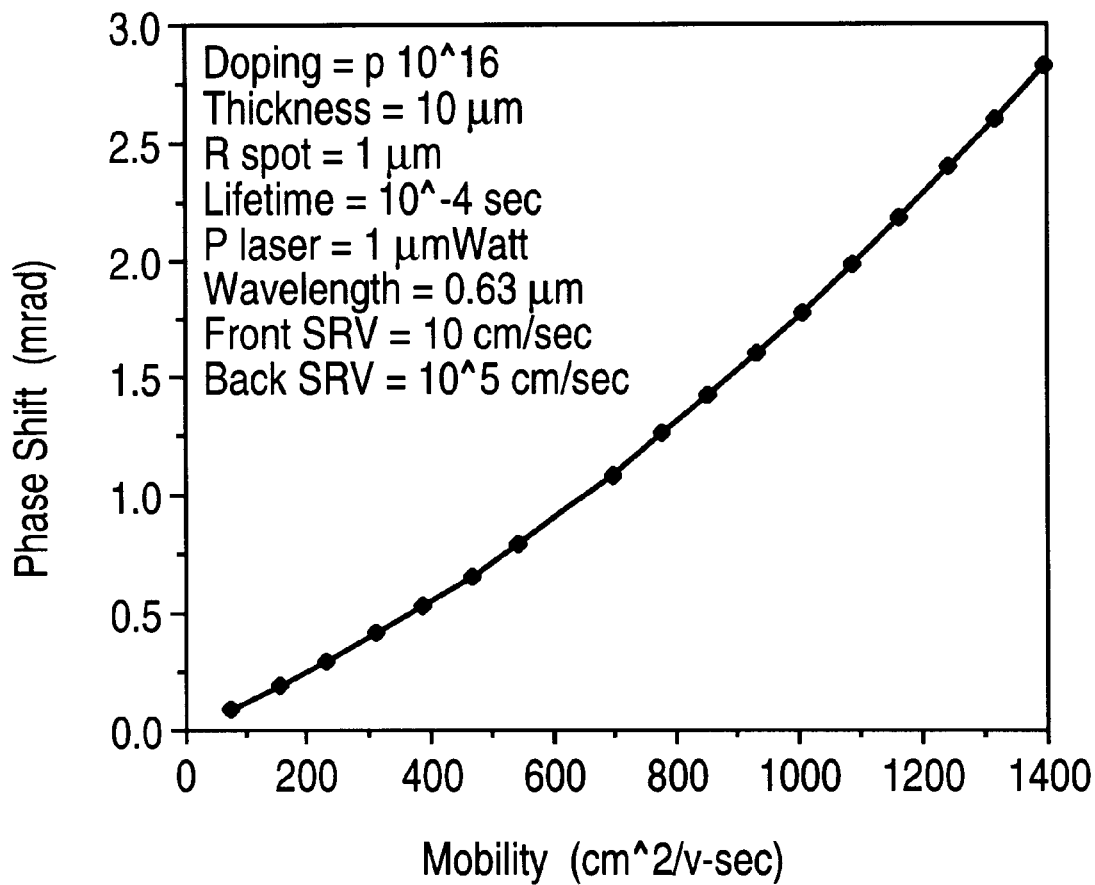
FIG. 10 is a graph showing the relationship between the phase shift, detected by the property measuring system, and the mobility property of the substrate.
Figure 11:
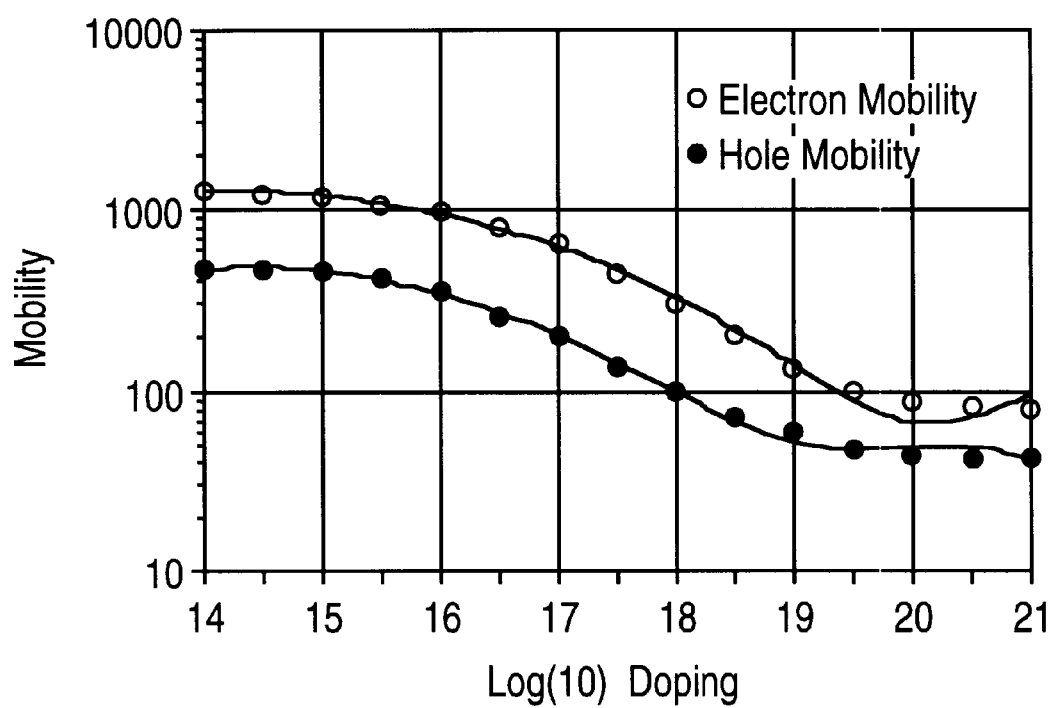
FIG. 11 is a graph showing the relationship between the mobility property of a substrate and the doping level of a substrate.

FIG. 10 shows a chart of the phase shift of the analyzer beam versus the mobility of the carriers. From this chart, assuming the conditions shown, it is possible to determine the mobility of the carriers within the substrate very accurately. For example, a phase shift of 0.5 mradians of the analyzer beam corresponds to a mobility of the carriers in that particular substrate of about 350 centimeters$^2$/v-sec. Thus, based on the phase shift caused by the carriers generated by the carrier beam, the mobility of the substrate may be precisely measured. FIG. 11 shows a chart of the relationship between the carrier mobility and the doping level of the substrate. Thus, with a measured phase shift, one may determine the mobility of the carriers, as described above, and also the doping level of the substrate in that region, based on the chart shown in FIG. 11.

Figure 12:
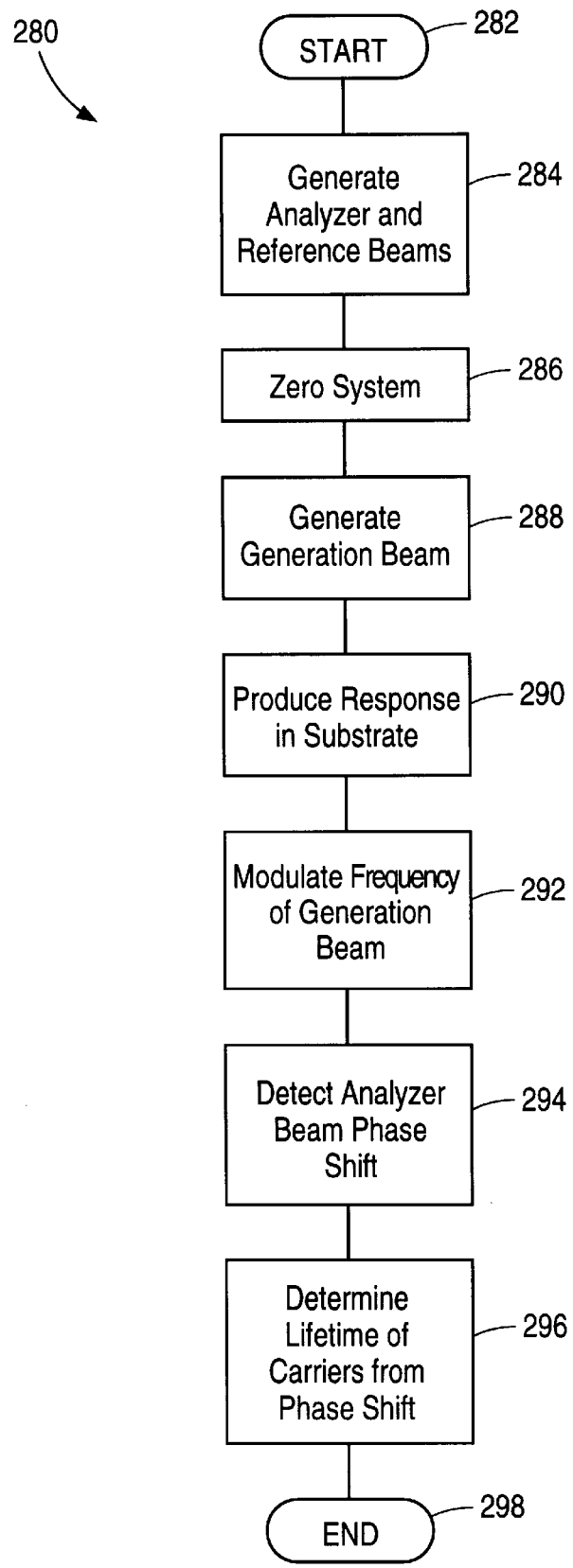
FIG. 12 is a flowchart showing a method of measuring the lifetime of carriers in a substrate in accordance with the invention.

FIG. 12 is a flowchart showing the method of measuring the lifetime of carriers within the substrate using the measuring system in accordance with the invention. In this mode, a long wavelength generation beam is used to generate approximately uniform carriers along the full depth of focus of the generation beam, which may be on the order of 10–15 μm. In epitaxial silicon or in a silicon substrate with intrinsic gettering and a denuded zone, this 10–15 μm is approximately the depth of the active region of the integrated circuit. For the analysis, the carriers are generated in a cylinder of diameter equal to the beam width at the focus. The solution for the carrier concentration is a function of the lifetime of the carriers. Also, for this method, the generation beam is modulated and swept through a plurality of frequencies to measure the lifetime of the carriers.

The method 280 begins at step 282. At step 284, the combined analyzer/reference beam is generated by the analyzer beam generator. The system is reset and zeroed at step 286 by using the analyzer and reference beams alone without the generation beam, as described above. In step 288, the generation beam is generated, and a response, at step 290, occurs within the substrate (i.e., carriers are generated in the substrate). The generation beam is then modulated in step 292 so that the frequency of the generation beam changes, and causes the generation of carriers within the substrate at different depths that may be measured to determine the lifetime of the carriers, as described below. The lifetime of the carriers in the substrate may also be measured by using a constant frequency generation beam, generating carriers in the substrate, and then measuring the decay curve to determine the lifetime of the carriers. In step 294, the generated carriers cause a phase shift of the analyzer beam, and the lifetime of the carriers is determined from the phase shift in step 296. In step 298, the method is completed.

To determine the lifetime of carriers from the phase shift of the analyzer beam, it is necessary to re-analyze the equations above for a varying frequency system. In particular, an oscillatory form is assumed for both the excess carrier concentration and the source, where $$n(r,t) = n(r)e^{j\omega t} \quad (17)$$

$$\Phi(t) = \Phi_0 e^{j\omega t} \quad (18)$$

In these equations, the $e^{j\omega t}$ term within both of these equations represents the frequency component. Using these two assumptions, equation 8, above, reduces to a partial derivative equation, which is $$\frac{\partial^2 n}{\partial r^2} + \frac{1}{r}\frac{\partial n}{\partial r} - \frac{n}{L^2} + \frac{G}{D} = 0 \quad (19)$$

where the diffusion length is $L^2 = D\tau$, and the lifetime of the carriers is a complex number, due to the frequency component, and is $$\tau = \frac{\tau_0}{1 + j\omega\tau_o} \quad (20)$$

where τ= the lifetime of the carriers, and $\tau_0$ is the lifetime of the carriers for a constant generation beam. The solution to this complex equation is assumed to be of the form $$n(x) = AI_o(x) - \frac{GL^2}{D} \quad (21)$$

where $I_o(x)$ is the modified Bessel function, which is a solution to the general differential equation of the form $$x^2 y'' + xy' - (x^2 + n^2)y = 0 \quad (22)$$

By comparing equation 22 and equation 19, the actual solution to the above differential equation is $$n(r) = AI_o\left(\frac{r}{L}\right) - \frac{GL^2}{D} \quad (23)$$

The constant is found by recognizing that the photon flux from the generation beam into the cylinder must equal the flux out of the cylinder which gives the boundary condition of $$\frac{G}{\alpha} = D\left(\frac{\partial n}{\partial r}\right)_{r=r_s} \quad (24)$$

Solving equation 22 by substitution of equation 21 with the boundary condition yields an equation for the excess minority carrier concentration, which is $$n(r) = \frac{GL}{\alpha D}\left[\frac{I_o\left(\frac{r}{L}\right)}{I_1}\right] - \alpha L \quad (25)$$

This equation may be reduced because $L >> r, r_s$, and that $1/r_s\alpha << 1$, so that the excess minority carrier concentration is $$n(r, t) = \frac{2G\tau(\tau_o, \omega)}{r_s \alpha} e^{j\omega t} \quad (26)$$

Figure 13:
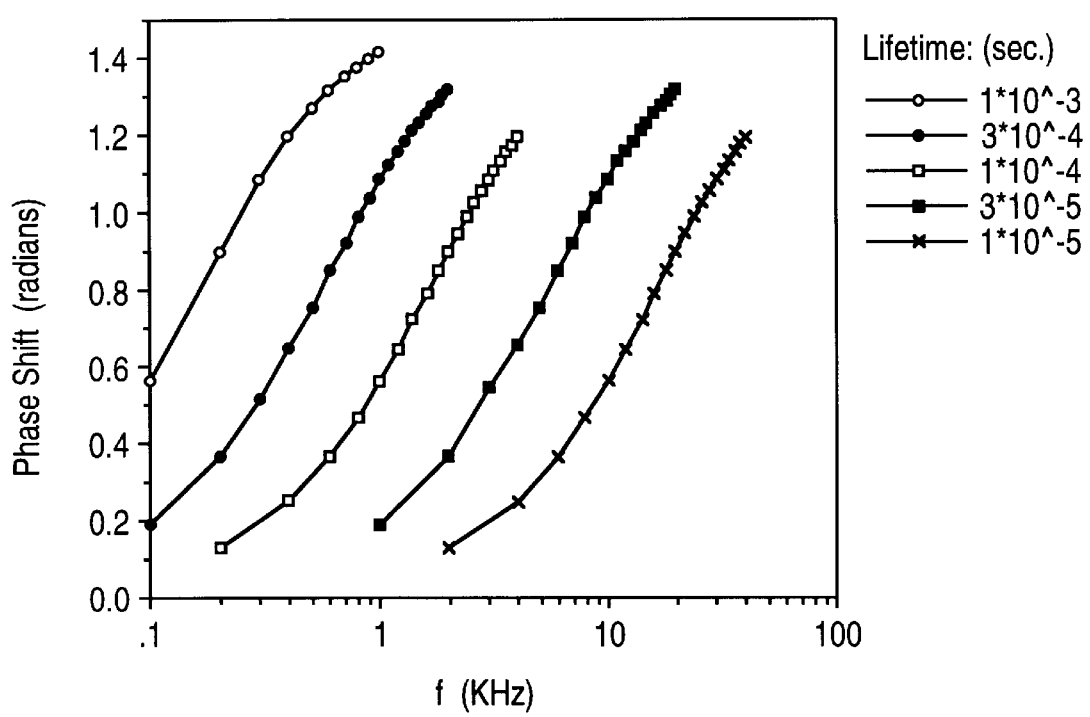
FIG. 13 is a graph showing the relationship between the carrier lifetime of the substrate and the phase shift over a frequency range.

The excess minority carrier concentration distribution is complex, and therefore, the index of refraction modulation is also complex. The lifetime is determined by measuring the phase shift between the modulation of the generation beam and the response of the index of refraction. This phase shift is dependent only on the modulation frequency, and the lifetime of the carriers. As shown in FIG. 13, a phase shift as a function of frequency corresponds to a particular lifetime. Thus, the lifetime of the carriers with the substrate may be measured accurately.

The measuring system in accordance with the invention may also be used to measure near-surface properties of the substrate as well as properties of the bulk substrate by using a generation beam system capable of producing a plurality of wavelengths because longer wavelengths penetrate deeper into a substrate, as shown in FIG. 5. This permits the measuring system in accordance with the invention to measure both the mobility of carriers in the channel of the a transistor and the lifetime of carriers within the bulk substrate. Since both of the measurements are quick and accurate, the measuring system may measure both properties during the production of the transistor.

While the foregoing has been with reference to a particular embodiment of the invention, it will be appreciated by those skilled in the art that changes in this embodiment may be made without departing from the principles and spirit of the invention, the scope of which is defined by the appended claims.

I claim:

1. A system for measuring the value of a property of a semiconductor substrate, comprising:

means for generating an analyzer beam;

means for generating a generation beam;

means for focusing the generation beam on the substrate and for focusing the analyzer beam on the substrate, the generation beam being superposed over the analyzer beam, and the generation beam generating carriers in an area of the substrate contacted by the generation beam, the generated carriers causing a change in a predetermined characteristic of the analyzer beam, the change in the predetermined characteristic of the analyzer beam corresponding to the property of the substrate;

means for detecting the change in the predetermined characteristic of the analyzer beam; and means for determining the value of the property of the substrate from the change in the predetermined characteristic of the analyzer beam.

2. The system of claim 1, wherein the means for generating the analyzer beam comprises means for generating a reference beam, the analyzer beam and the reference beam being substantially parallel and spaced apart relative to each other so that the analyzer beam and the reference beam are substantially non-overlapping.

3. The system of claim 2, wherein detecting the change in the predetermined characteristic comprises means for measuring the phase of the analyzer beam relative to the phase of the reference beam.

4. The system of claim 2, wherein the analyzer beam has a first polarization, and the reference beam has a second polarization, and further comprising means for combining the analyzer beam and the reference beam into a single beam.

5. The system of claim 4, wherein the change in the predetermined characteristic detecting means comprises means for generating a first signal corresponding to a sum of the values of the analyzer beam and the reference beam, means for generating a second signal corresponding to a difference between the values of the analyzer beam and the reference beam, and means for subtracting the sum signal from the difference signal to generate the phase shift signal.

6. The system of claim 5, wherein the property determining means comprises means for determining a change in an index of refraction of the substrate from the phase shift, and means for determining the property of the substrate from the change in the index of refraction on the substrate.

7. The system of claim 2, wherein the analyzer beam generator comprises means for selecting the photon energy of the analyzer beam and of the reference beam so that both beams pass through the substrate.

8. The system of claim 7, wherein the analyzer beam and the reference beam are spaced apart by a distance on the order of one micrometer.

9. The system of claim 7, wherein the analyzer beam and the reference beam each have a photon energy that is less than the bandgap of the substrate.

10. The system of claim 2, wherein the analyzer beam generator comprises means for selecting the photon energy of the analyzer beam and of the reference beam so that both beams reflect off of the substrate.

11. The system of claim 10, wherein the analyzer beam and the reference beam are spaced apart by a distance on the order of one micrometer.

12. The system of claim 10, wherein the analyzer beam and the reference beam each have a photon energy that is greater than the bandgap of the substrate.

13. The system of claim 2, wherein the generation beam generator comprises means for modulating the frequency of the generation beam to generate a plurality of carriers in the substrate in order to measure a lifetime of the carriers.

14. The system of claim 1, wherein the generation beam generator is a laser that emits a beam with a wavelength shorter than 1100 nm.

15. The system of claim 1, wherein the generation beam generator comprises a white light source for generating electromagnetic radiation over a predetermined spectrum having a range of wavelengths, and means for selecting a beam of a predetermined wavelength from the white light source.

16. The system of claim 1, further comprising means for electrically biasing the surface of the substrate by applying a plurality of charged atoms to the surface of the substrate to control the concentrations of carriers near the surface of the substrate.

17. The system of claim 1, further comprising means for blocking said generation beam in order to locate a defect in the substrate, and wherein a property of the defect in the substrate is determined.

18. A method for measuring a value of a property of a semiconductor substrate, comprising:

generating an analyzer beam;

generating a generation beam;

focusing the generation beam on the substrate and focusing the analyzer beam on the substrate, the generation beam being superposed over the analyzer beam, and the generation beam generating carriers in an area of the substrate contacted by the generation beam, the generated carriers causing a change in a predetermined characteristic of the analyzer beam, the change in a predetermined characteristic of the analyzer beam corresponding to the property of the substrate;

detecting the change in a predetermined characteristic of the analyzer beam; and determining the value of the property of the substrate from the change in a predetermined characteristic of the analyzer beam.

19. The method of claim 18, wherein generating the analyzer beam comprises generating a reference beam, the analyzer beam and the reference beam being substantially parallel and spaced apart relative to each other so that the analyzer beam and the reference beam are substantially non-overlapping.

20. The method of claim 19, wherein detecting the change in the predetermined characteristic comprises measuring the phase of the analyzer beam relative to the phase of the reference beam.

21. The method of claim 19, wherein the analyzer beam has a first polarization, and the reference beam has a second polarization, and further comprising combining the analyzer beam and the reference beam into a single beam.

22. The method of claim 21, wherein the change in the predetermined characteristic detecting comprises generating a first signal corresponding to a sum of the values of the analyzer beam and the reference beam, generating a second signal corresponding to a difference between the values of the analyzer beam and the reference beam, and subtracting the sum signal from the difference signal to generate the phase shift signal.

23. The method of claim 22, wherein determining the property comprises determining a change in an index of refraction of the substrate from the phase shift, and determining the property of the substrate from the change in the index of refraction on the substrate.

24. The method of claim 19, wherein generating the analyzer beam comprises selecting the photon energy of the analyzer beam and of the reference beam so that both beams pass through the substrate.

25. The method of claim 24, wherein the analyzer beam and the reference beam are spaced apart by a distance on the order of one micrometer.

26. The method of claim 24, wherein the analyzer beam and the reference beams each have a photon energy that is less than the bandgap of the substrate.

27. The method of claim 19, wherein generating the analyzer beam comprises selecting the photon energy of the analyzer beam and of the reference beam so that both beams reflect off of the substrate.

28. The method of claim 27, wherein the analyzer beam and the reference beam are spaced apart by a distance on the order of one micrometer.

29. The method of claim 27, wherein the analyzer beam and the reference beams each have a photon energy that is greater than the bandgap of the substrate.

30. The method of claim 19, wherein generating the generation beam comprises modulating the frequency of the generation beam to generate a plurality of carriers in the substrate in order to measure a lifetime of the carriers.

31. The method of claim 18, wherein the generation beam has a wavelength shorter than 1100 nanometers.

32. The method of claim 18, wherein generating the generation beam comprises generating electromagnetic radiation of a predetermined spectrum over a range of wavelengths with a white light source, and selecting a beam of a predetermined wavelength from the white light source.

33. The method of claim 18, further comprising electrically biasing the surface of the substrate by applying a plurality of charged atoms to the surface of the substrate to control the concentrations of carriers near the surface of the substrate.

34. The method of claim 18 further comprising blocking said generation beam in order to locate a defect in the substrate, and wherein a property of the defect in the substrate is determined.

35. A method of measuring the value of a property of a device on a semiconductor substrate during the fabrication process of the device, the fabrication process including a plurality of processes for forming various portions of the device, the method of measuring properties of the semiconductor substrate and device, comprising:

generating an analyzer beam;

generating a generation beam;

focusing the generation beam on the substrate and focusing the analyzer beam on the substrate, the generation beam being superposed over the analyzer beam, and the generation beam generating carriers in an area of the substrate contacted by the generation beam, the generated carriers causing a change in a predetermined characteristic of the analyzer beam, the change in the predetermined characteristic of the analyzer beam corresponding to the property of the substrate;

detecting the change in the predetermined characteristic of the analyzer beam; and determining the value of the property of the substrate from the change in the predetermined characteristic of the analyzer beam.

36. The method of claim 35, further comprising controlling the fabrication process based on the measured property.

37. The method of claim 35, wherein the analyzer beam and the reference beam have a predetermined photon energy so that both beams pass through the substrate.

38. The method of claim 37, wherein the photon energy is less than the bandgap of the substrate.

39. The method of claim 35, wherein the analyzer beam and the reference beam have a predetermined photon energy so that both beams are reflected by the substrate.

40. The method of claim 39, wherein the predetermined photon energy is greater than the bandgap of the substrate.

41. A system for measuring the value of a property of a semiconductor substrate, comprising:

means for directing a first beam of electromagnetic energy to the substrate to generate a plurality of charge carriers in a localized region of the substrate impinged by the first beam;

means for directing a second beam of electromagnetic energy to the substrate;

means for measuring a property of the substrate, based on the plurality of generated charge carriers, by detecting a change in a predetermined characteristic of the second beam of electromagnetic energy; and means for determining the property of the substrate from the change in the predetermined characteristic of the second beam.

* * * * *